United States Patent [19]
Nakamura

[11] Patent Number: 5,340,639
[45] Date of Patent: Aug. 23, 1994

[54] PRINTED-WIRING BOARD

[75] Inventor: Hirofumi Nakamura, Tokyo, Japan

[73] Assignee: NEC Corporation, Tokyo, Japan

[21] Appl. No.: 765,236

[22] Filed: Sep. 25, 1991

[30] Foreign Application Priority Data

Sep. 26, 1990 [JP] Japan ................... 2-255640

[51] Int. Cl.$^5$ .............................. H05K 3/28
[52] U.S. Cl. ................... 428/192; 156/666;
156/659.1; 156/652; 428/901; 361/760;
361/767; 361/748
[58] Field of Search ............ 156/655, 651, 652, 666,
156/659.1; 361/397, 400, 403, 404; 428/192,
901

[56] References Cited

U.S. PATENT DOCUMENTS

| 4,780,794 | 10/1988 | Miase et al. | 361/401 |
| 5,147,084 | 9/1992 | Behen et al. | 228/56.3 |

FOREIGN PATENT DOCUMENTS

| 53-149673 | 12/1978 | Japan . |
| 1321683 | 12/1989 | Japan . |
| 2090697 | 3/1990 | Japan . |
| 2137292 | 5/1990 | Japan . |

Primary Examiner—Brian E. Hearn
Assistant Examiner—George Goudreau
Attorney, Agent, or Firm—Leydig Voit & Mayer

[57] ABSTRACT

A printed-wiring board wherein an insulating resin is coated on the sides of pads for being loaded with a surface mounted part, whereby it becomes possible to inhibit occurrence of soldering bridges in soldering the surface mounted part to the printed-wiring board.

4 Claims, 4 Drawing Sheets

PRINTED-WIRING BOARD

BACKGROUND OF THE INVENTION

1. Field of the Invention

This invention relates to a printed-wiring board and particularly a structure of a pad portion which is loaded with a surface mounted part.

2. Disclosure of the Prior Art

In the past, there has been a printed-wiring board having pads 2 for being loaded with surface mounted parts on the surface of an insulating substrate 1, as shown in FIG. 1(a), wherein the side walls of the pads have an exposed form and the section thereof has a trapezoid or a form similar to that. Such printed-wiring board is obtained by a technique which comprises photoetching the insulating substrate 1 on which a conductive foil is spreaded and fixed or a pattern plating technique which comprises applying a heavy gage copper plating on the insulating substrate 1, on which a conductive foil is spreaded and fixed, in the form of a desired pattern and thereafter carrying out a quick etching to obtain the desired pattern, or the like. The thus obtained printed-wiring board is widely used in various industrial field.

Moreover, the above printed-wiring board can be generally produced according to, for example, a process as shown in FIGS. 2(a) to (f). First, as shown in FIG. 2(a), a hole for forming a through-hole portion is mounted in an insulating substrate 1 with copper foils 12 being spreaded and fixed on both main surfaces of inside and outside thereof; as shown in FIG. 2(b), a panel copper plating layer 13 is formed on an inner wall of the hole for forming the through-hole portion and on the main surfaces of the copper foils 12; as shown in FIG. 2(c), an etching resist layer 14 is formed in a desired pattern; as shown in FIG. 2(d), an etching treatment is made by using the etching resist layer 14 as an etching mask to obtain a desired circuit pattern 13a. In addition, as shown in FIG. 2(e), the etching resist layer 14 is stripped off and removed; and as shown in FIG. 2(f), a soldering resist layer 16 is formed.

In the prior printed-wiring board as mentioned above, as shown in FIG. 1(b), a conductive material at the side walls of the pads 2 for being loaded with the surface mounted part remains exposed. Thus, in the case that the pads 2 are bonded to a lead 4 of a part by a soldering process of a reflow system wherein cream solder is used, there is a defect that solder 5 is adhered to an exposed conductive surface of the sides of the pads 2 and as result soldering bridge takes place between adjacent pads due to soldering balls 5a.

SUMMARY OF THE INVENTION

The object of the present invention is to alleviate the above-mentioned disadvantages and defects by arranging the printed-wiring board in such a manner that a soldering bridge does not occur between the pads.

Accordingly, the above object is accomplished by providing a printed-wiring board including an insulating resin disposed or coated on the side walls of pads suitable for receiving a surface mounted part. The insulating resin is preferably an alkyl imidazole resin.

According to one aspect of the invention, a printed-wiring board includes an insulating resin coated only on sidewalls of the pads to be loaded with a surface mount part.

BRIEF DESCRIPTION OF THE DRAWINGS

By way of example of the many features and advantages of the invention, illustrative embodiment in the form of the printed-wiring board is described below and shown in the accompanying drawings, in which.

DETAILED DESCRIPTION OF THE PREFERRED EMBODIMENT

Next, this invention will be described with reference to the accompanying drawings.

EXAMPLE

Next, this invention will be described with reference to the accompanying drawings.

Figure 1A:
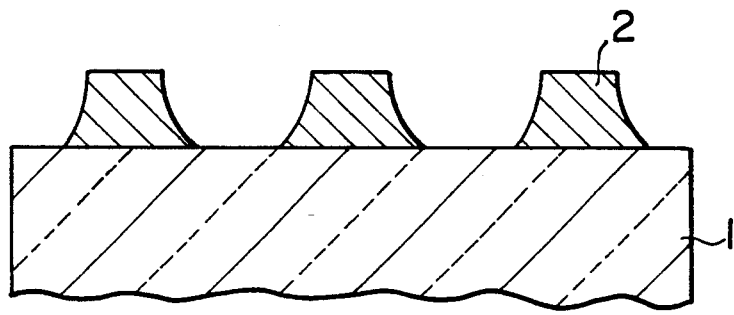
FIG. 1(a) shows a sectional view of the prior printed-wiring board.
Figure 1B:
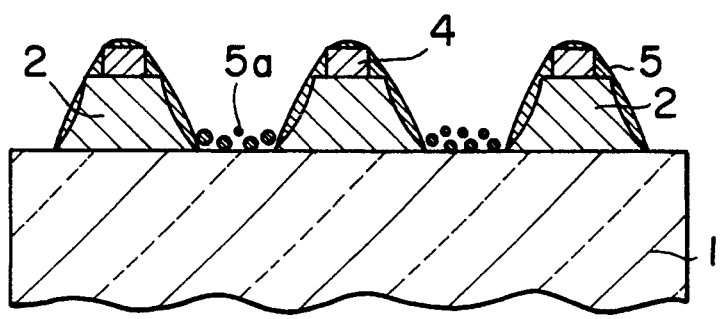
FIG. 1(b) shows a sectional view of the prior printed-wiring, as shown in FIG. 1(a), board which is loaded with a surface mounted part.
Figure 3A:
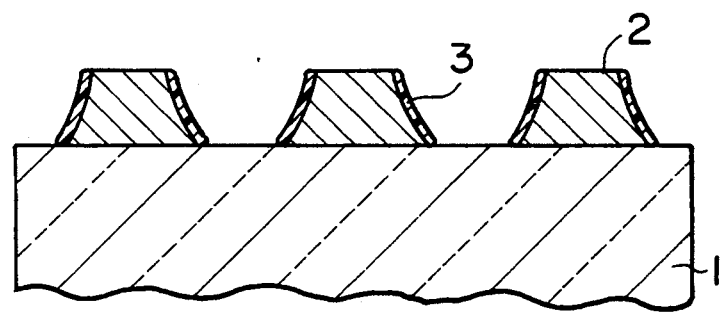
FIG. 3(a) shows a sectional view of a printed-wiring board according to one embodiment of this invention.
Figure 3B:
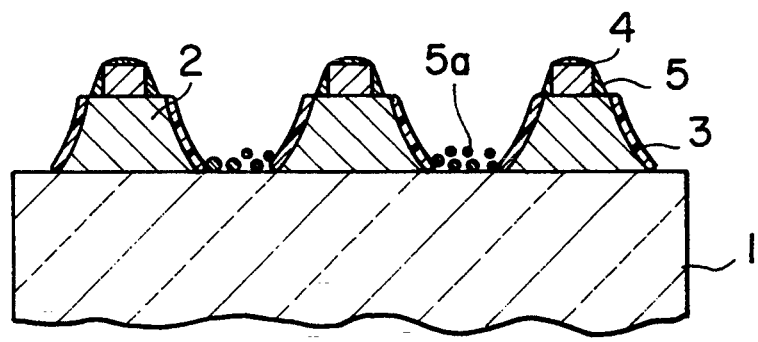
FIG. 3(b) shows a sectional view of the printed-wiring board, as shown in FIG. 3(a), which is loaded with a surface mounted part.
Figure 2A:
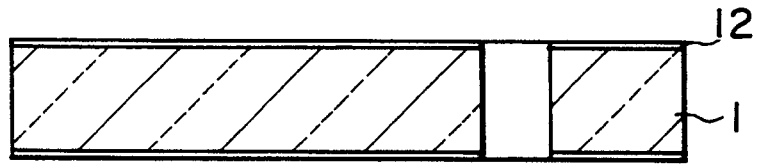
FIGS. 2(a) to (f) show a sectional view of the prior printed-wiring board, in the order of the manufacturing process.
Figure 2B:
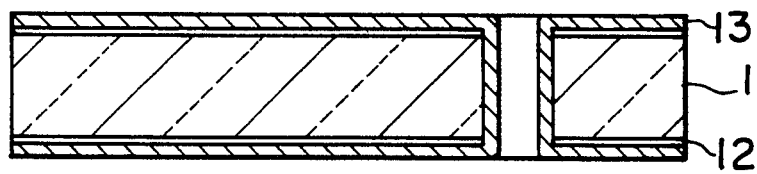
Figure 2C:
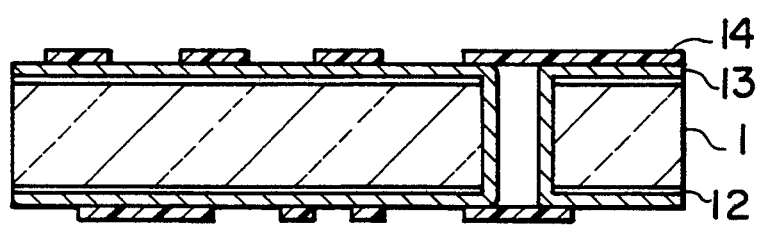
Figure 2D:
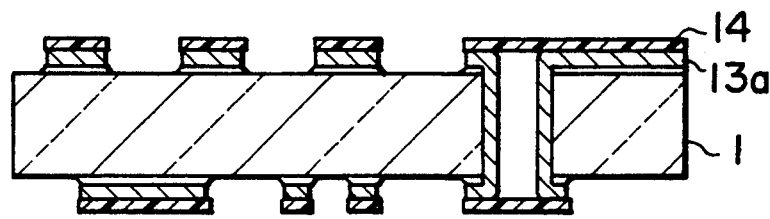
Figure 2E:
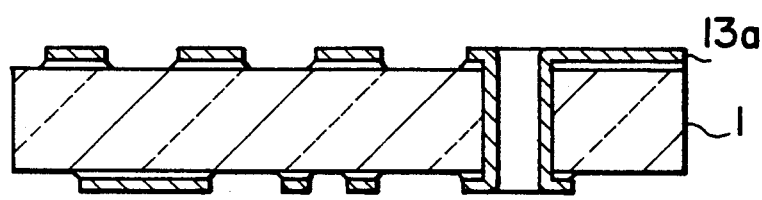
Figure 2F:
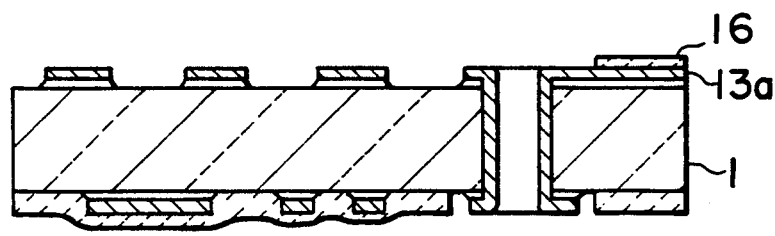

FIG. 3(a) and FIG. 3(b) show a sectional view of a printed-wiring board according to one embodiment of this invention, in the order of the manufacturing process.

As shown in FIG. 3(a), in the printed-wiring board of this example, an insulating resin 3 is formed on the sides of pads 2 for being loaded with a surface mounted part, said pads being formed on the top surface of an insulating substrate 1.

FIG. 3(b) shows a sectional view of configuration of the printer-wiring board in such a state that the printed-wiring board as shown in FIG. 3(a) is loaded with a lead 4 for the surface mounted part. The lead 4 is fixed on the pads 2 by soldering 5. In such a case, even if soldering balls 5a generated in mounting the part are adhered between the pads, the insulating resin 3 prevents these balls from being directly contacted with the sides of the pads 2 for being loaded with the surface mounted part.

Now, the following Table 1 shows the test result exhibiting the effect of this example. This test was carried out according to a method which comprises screen-printing cream soldering on the printed-wiring board, being loaded with QFP and allowing the cream soldering to reflow by an infrared reflow device to solder it.

TABLE 1

|  | Prior Art | This Example |
|---|---|---|
| Soldering Bridge Occurrence (%) | 3.20 | 0.34 |

Reflow Condition: 150° C. 90 seconds, 235° C., 20 seconds

QFP used: T-QFP having 0.5 mm pitch lead

Sample Number: 100 of T-QFP

As can be seen from the aforementioned Table 1, it was found that the printed-wiring board of this example had a good advantage that occurrence of the soldering bridge in the surface mounted way is reduced.

Next, one example of a method for manufacturing the printed-wiring board of one embodiment of this invention is described according to the order of a manufacturing process with reference to FIG. 4(a) to FIG. 4(g).

Figure 4A:
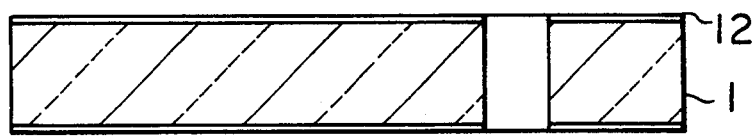
FIGS. 4(a) to (g) show a sectional view of the printed-wiring board according to one embodiment of this invention, in the order of the manufacturing process.
Figure 4B:
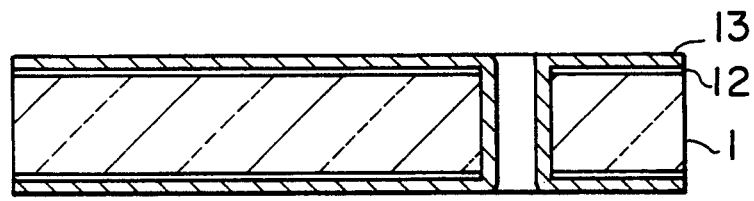
Figure 4C:
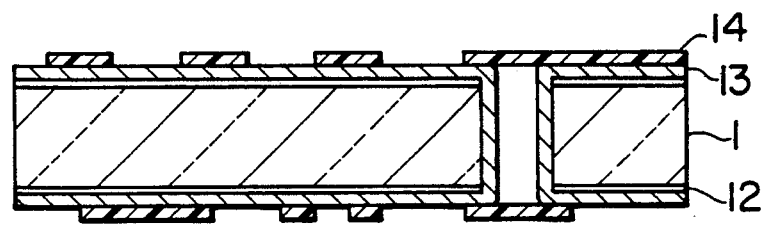
Figure 4D:
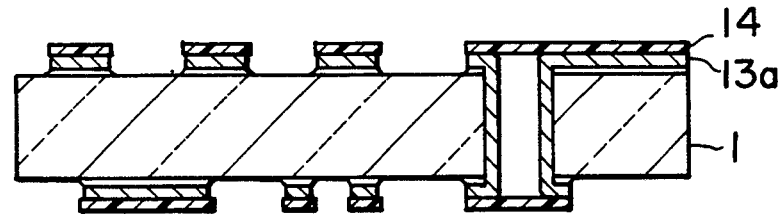
Figure 4E:
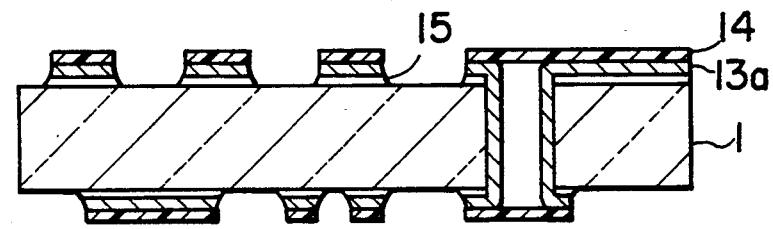
Figure 4F:
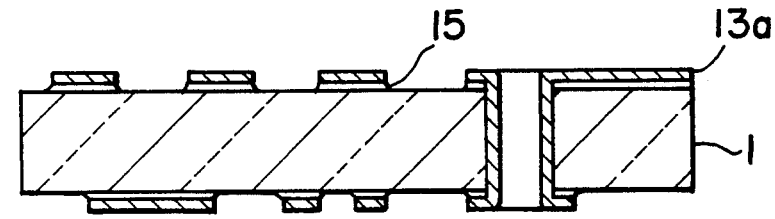
Figure 4G:
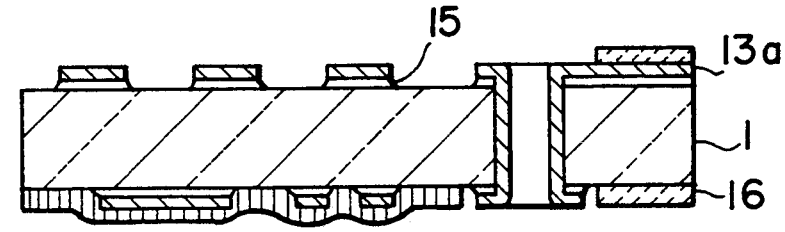

As shown in FIG. 4(a), first, a hole for forming a through-hole portion is mounted in an insulating substrate 1 with copper foils 12 being spreaded and fixed on the inside and outside thereof; as shown in FIG. 4(b), a panel copper plating layer 13 is formed on the inner wall of the hole for forming the through-hole portion and on the main surfaces of the copper foils 12; as shown in FIG. 4(c), an etching resist layer 14 is formed in a desired pattern; and as shown in FIG. 4(d), an etching treatment is made by using the etching resist layer 14 as an etching mask to obtain a desired circuit pattern 13a. In addition, as shown in FIG. 4(e), the insulating substrate 1 is dipped in an aqueous solution, in which alkyl imidazole is dissolved, for 3 to 10 minutes and an insulating resin 15 being alkyl imidazole is deposited in a thickness of 3 to 10 $\mu$m only on an exposed copper surface on the side walls of the circuit pattern 13a; and thereafter, as shown in FIG. 4(f), the etching resist layer 14 is stripped off and removed by using 1 to 3% sodium hydroxide solution and heating is made at 130° to 150° C. for 30 to 60 minutes to allow the insulating resin 15 to harden. Finally, as shown in FIG. 4(g), a solder resist layer 16 is formed in a desired pattern to obtain a desired printed-wiring board.

FIGS. 5(a) to (g) show a sectional view of a printed-wiring board according to another embodiment of this invention, in the order of the manufacturing process.

Figure 5A:
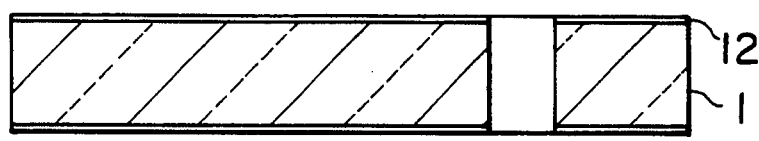
FIGS. 5(a) to (g) show a sectional view of a printed-wiring board according to another embodiment of this invention, in the order of the manufacturing process.
Figure 5B:
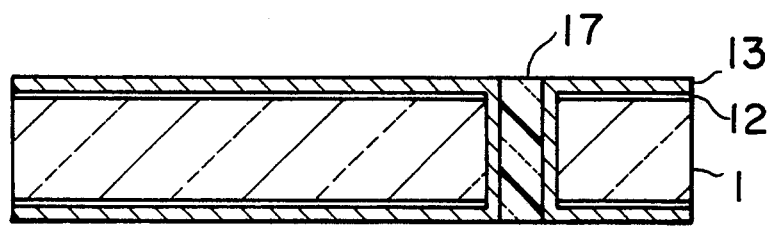
Figure 5C:
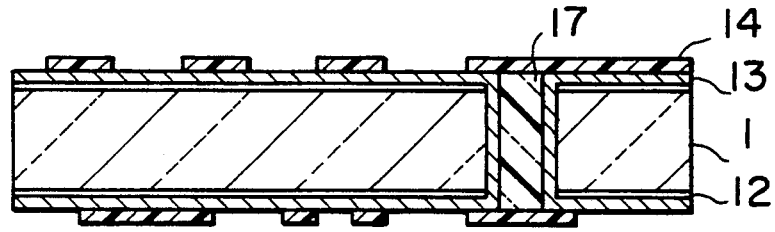
Figure 5D:
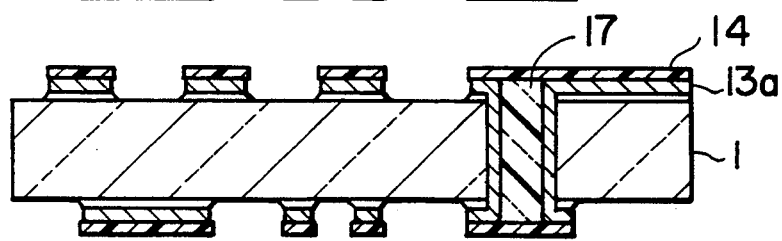
Figure 5E:
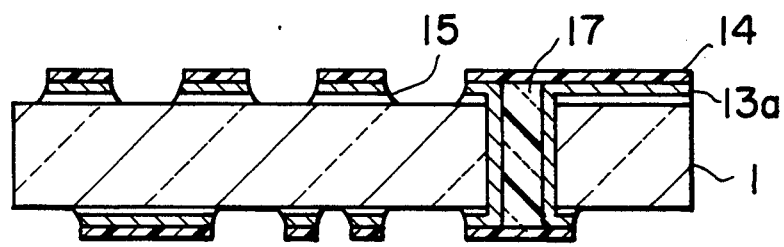
Figure 5F:
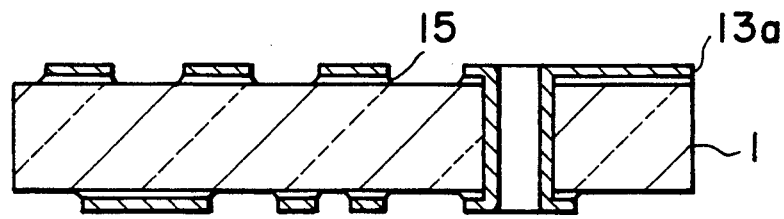
Figure 5G:
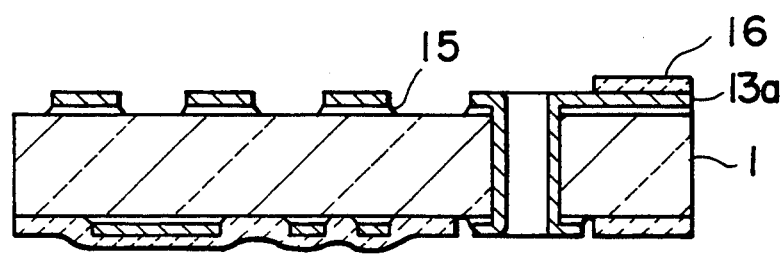

As shown in FIG. 5(a), first, a hole for forming a through-hole portion is mounted in an insulating substrate 1 with copper foils 12 being spreaded and fixed on two main surfaces of the inside and outside thereof; and, as shown in FIG. 5(b), a panel copper plating layer 13 is formed on the inner wall of the hole for forming the through-hole portion and on the main surfaces of the copper foils 12, and in addition the hole is filled with a resin 17 for filling a gap and the resin is photo-set. Then, as shown in FIG. 5(c), an etching resist layer 14 is formed in a desired pattern; and as shown in FIG. 5(d), an etching treatment is made by using the etching resist layer 14 as an etching mask to obtain a desired circuit pattern 13a. In addition, as shown in FIG. 5(e), the insulating substrate 1 is dipped in an aqueous solution, in which alkyl imidazole is dissolved, for 3 to 10 minutes and an insulating resin 15 being alkyl imidazole is deposited in a thickness of 3 to 10 $\mu$m only on an exposed copper surface on the side walls of the circuit pattern 13a; and thereafter, as shown in FIG. 5(f), the etching resist layer 14 and the gap-filling resin 17 are stripped off and removed by using 1 to 3% sodium hydroxide solution and heating is made at 130° to 150° C. for 30 to 60 minutes to allow the insulating resin 15 to harden. Finally, as shown in FIG. 5(g), a solder resist layer 16 is formed in a desired pattern to obtain a desired printed-wiring board. Since the insulating resin 15 is formed as mentioned above, even if soldering balls occurred in soldering the lead of the part to the circuit pattern 13a of the printed-wiring board, it is possible to secure electrical insulating properties between the circuit pattern 13 and adjacent circuit pattern by the insulating resin 15.

What is claimed is:

1. A printed-wiring board wherein an insulating resin is coated only on sidewalls of pads to be loaded with a surface mount part.

2. A printed-wiring board as set forth in claim 1 wherein the insulating resin is alkyl imidazole.

3. A printed-wire board comprising:
   a copper-clad insulating substrate,
   a circuit pattern disposed on the copper-clad insulating substrate;
   an alkyl imidazole insulating film 3 to 10 $\mu$m thick deposited on only an exposed copper surface of sidewalls of said circuit pattern; and
   solder resist layer formed on said substrate in a desired pattern.

4. A printed wiring board comprising:
   a substrate having a first major surface;
   a pad having first and second major surfaces and side surfaces extending therebetween, the first major surface of the pad disposed on the first major surface of the substrate; and
   an alkyl imidazole insulating film having a thickness of 3 to 10 $\mu$m, being disposed at most on the side surfaces of the pad and forming an insulating coating thereon, and not being disposed on the second major surface of the pad and the substrate, wherein the alkyl imidazole insulating film is hardened by heating the printed wiring board;
   a solder resist layer selectively disposed on the pads.

* * * * *